United States Patent [19]

Plummer, Jr. et al.

[11] Patent Number: 5,301,720

[45] Date of Patent: Apr. 12, 1994

[54] METHOD FOR USE IN THE MANUFACTURE OF SEMICONDUCTOR DEVICES AND APPARATUS FOR USE IN CONNECTION WITH THE METHOD

[75] Inventors: Lawrence L. Plummer, Jr.; Boon-Meng Chan; See-Lian Gan; Hok-Ming Chan, all of Kwun Tong, Hong Kong

[73] Assignee: Kras Asia Ltd., Hong Kong, Hong Kong

[21] Appl. No.: 888,138

[22] Filed: May 26, 1992

[51] Int. Cl.⁵ .............................................. B21F 1/02
[52] U.S. Cl. ........................................... 140/147
[58] Field of Search ............................ 140/147, 105

[56] References Cited

U.S. PATENT DOCUMENTS 4,481,984 11/1984 Linker ............................ 140/147
5,219,404 6/1993 Moore et al. .................... 140/147

FOREIGN PATENT DOCUMENTS 3-3722 2/1992 Japan ................................. 140/147
1078548 8/1967 United Kingdom ............... 140/147

Primary Examiner—Lowell A. Larson
Attorney, Agent, or Firm—Burns, Doane, Swecker & Mathis

[57] ABSTRACT

Distortions of electrical leads projecting from an integrated circuit chip are corrected simultaneously instead of in sequence to prevent a corrected distortion from reappearing.

Semiconductor components are manufactured by means of electrically conductive plastic tools instead of steel tools thereby greatly reducing the cost of manufacture and handling.

8 Claims, 6 Drawing Sheets

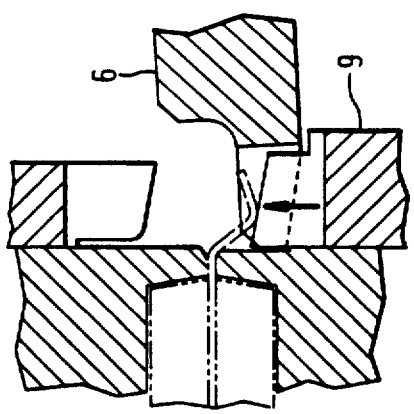
FIG. 10 LEAD DEFORMING
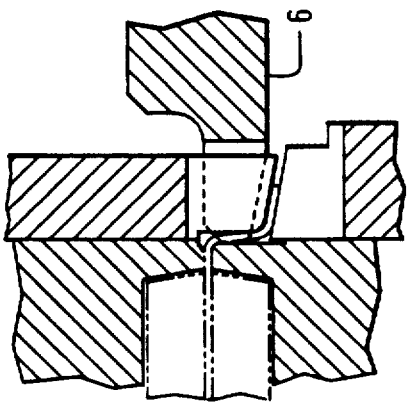
FIG. 13 "COMB" RETRACT
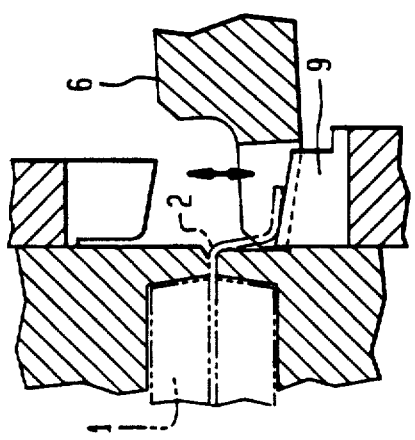
FIG. 9 LEAD SKEW CORRECTION
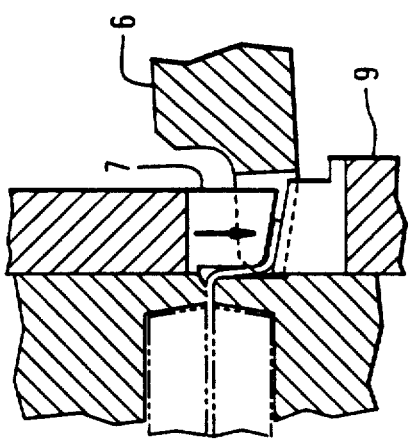
FIG. 12 LEAD FINAL FORM
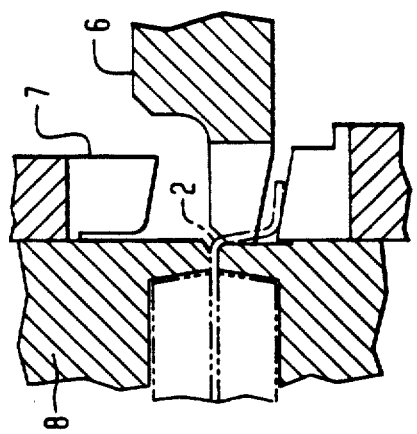
FIG. 8 GUIDING & CLAMPING
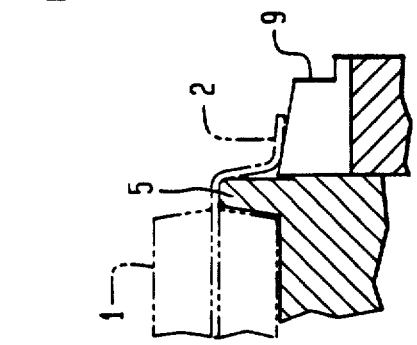
FIG. 7 PLACING
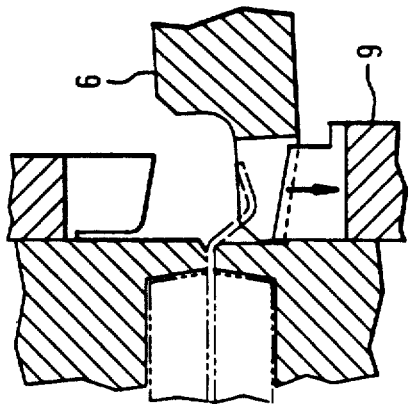
FIG. 11 FORM ANVIL RETRACT

METHOD FOR USE IN THE MANUFACTURE OF SEMICONDUCTOR DEVICES AND APPARATUS FOR USE IN CONNECTION WITH THE METHOD

FIELD OF THE INVENTION

The present invention relates to methods for use in the manufacture of semiconductor devices and to apparatus for use in connection with the methods.

The invention is particularly concerned with integrated circuit chips of the type comprising an insulated body having projecting therefrom an array of mutually parallel closely spaced apart projecting electrical leads. Integrated circuit chips of this type are mass produced and are the basic building blocks from which larger electrical circuits may be assembled. More particularly, a larger electrical circuit is assembled by producing a custom made printed circuit board (PCB), and then attaching to this board a variety of different integrated circuit chips of the type described, as well as other electrical components. The integrated circuit chips are connected to the printed circuit board by soldering. The assembly and soldering operations may be carried out by robot.

It will be appreciated that if a defective chip is incorporated into a large circuit, then the entire circuit will be useless. Accordingly, integrated circuit chips of the type described are subjected to severe quality control tests before assembly. If a chip is defective in that the semi-conductor circuits within the integrated circuit chip are defective this cannot be remedied and the chip is discarded. However, if a chip is defective in that the projecting electrical leads are distorted, it may be possible to correct the distortion and subsequently make use of the chip.

The electrical leads projecting from an integrated circuit chip may be distorted in a wide variety of different manners. However, three types of distortion are relatively common and are capable of being corrected. The first type of distortion is that an electrical lead may be skewed to one side so that it is too near to its neighbour on one side and too far from its neighbour on the other side, so that when positioned on a printed circuit board the skewed lead will contact the printed circuit board slightly to one side of the appropriate position, thereby failing to make contact with the appropriate part of the printed circuit. The second type of distortion is lack of coplanarity so that the foot of one electrical lead is at a higher or lower level than that of its neighbours. As a result when the integrated circuit chip is positioned on the printed circuit board some of the electrical leads will contact the printed circuit board but others will not. The third type of distortion is that the foot of an electrical lead may be inclined at an angle to the plane of the integrated circuit chip different to the required or specified angle. As a result when the integrated circuit chip is positioned on the printed circuit board the effectiveness of the soldering operation may be adversely effected.

PRIOR ART

The traditional method of correcting these three distortions is to first correct the skew angle and to then subsequently and separately correct the coplanarity and foot angle. For this purpose apparatus is used which comprises three workstations and conveyors between these workstations. When an integrated circuit chip fails a quality control test no analysis is made of the particular type of distortion which has caused the chip to fail the test, but rather the chip is simply fed into an apparatus of the type described and proceeds through all three workstations.

The traditional apparatus for correcting the defects comprises a first workstation provided with a metal comb having teeth spaced apart with the same spacing as the projecting leads of the integrated circuit chip. In operation the comb moves into meshing engagement with the electrical leads and then the comb is moved reciprocally a number of times parallel to the length of the leads in a combing action to remove any skew distortion. The second workstation deforms all the leads upwardly relative to the horizontal plane of the chip. The third workstation includes metal punches which punch the leads so as to give the leads their final shape which is retained without any resilience or spring back because of the deformation at the second workstation.

In use of the metal punches, each time the punch which is made of hard metal punches a foot which is made of soft metal, the result is that some soft metal is transferred to the working surface of the punch. As a result, the working surface of the punch becomes distorted. This distortion is removed by removing the punch from the apparatus, and then using a suitable solvent to remove the soft metal from the punch, and then re-inserting the punch in the apparatus for further use. In addition the punch becomes worn and must be removed for regrinding of the surface which is very labour intensive.

The use of multiple workstations and intermediate conveyors has the disadvantage that where a distortion is removed at one workstation, the same distortion or a different distortion may be introduced during subsequent handling by the conveyors or at subsequent workstations. By way of example the skew angle removed at the first workstation may be reintroduced at the second or third workstation. A further disadvantage is that the cycle time of the apparatus is quite lengthy because of the multiple operations.

The punches suffer from the disadvantages that firstly the punches are extremely expensive to manufacture to the appropriate tolerance, secondly the apparatus must be stopped from time to time to remove and clean and recondition the punches, and thirdly during such removal there exists the risk of breaking the very delicate and expensive punches.

OBJECT AND SUMMARY OF THE INVENTION

An object of the present invention is to provide an improved method of correcting distortions of the electrical leads of integrated circuit chips, and to provide an improved apparatus for use in connection with the method.

In accordance with a first aspect of the invention there is provided a method of correcting distortion of electrical leads projecting from an integrated circuit chip comprising the steps of correcting several possible distortions simultaneously.

The invention also provides apparatus for use in correcting distortion of electrical leads projecting from an integrated circuit chip comprising a single workstation provided with tools for correcting several possible distortions, the tools being operable to simultaneously engage the leads.

The principal advantage of the method and apparatus according to the first aspect of the invention is that the handling of the integrated circuit chip is greatly reduced with the distortions being corrected simultaneously, as a result of which any distortion which is removed is not re-introduced and the yield of corrected integrated circuit chips which pass the quality control test is substantially improved.

In accordance with a second aspect of the invention there is provided apparatus for use in the manufacture of semiconductor devices, in which the tools are of electrically conductive plastic material.

The principal advantage of the apparatus in accordance with the second aspect of the invention is that the cost of the apparatus may be greatly reduced. For example in the case of apparatus for correcting distortion of electrical leads by means of punches, the cost of production of plastic punches machined to the required tolerance is only a tiny fraction of the cost of production of metal punches. In particular making plastic punches involves a capital outlay for the mould but thereafter involves relatively little expense. In contrast metal punches must be made individually with individual grinding and polishing. As a result the plastic punches may simply be discarded when they become distorted, and may be replaced by new punches. Thus the cost of punches is reduced, there is no need for regular maintenance and cleaning with the solvent, and the downtime of the apparatus is greatly reduced.

The requirement that the plastic be electrically conductive arises because integrated circuit chips of the type described are highly electrically sensitive, such that even a very tiny charge of static electricity may irreparably damage the chip. For this reason the chips are manufactured in batches contained within an electrically conductive metal frame which acts as an earth to prevent any build-up of static electricity. However, once the integrated circuit chips reach the quality control stage, it is necessary to detach the chips from the frame and test each chip separately. In order to prevent damage due to a build-up of static electricity, at least those components of the quality control and correcting apparatus which come into contact with the integrated circuit chips must be electrically conductive.

Other objects and advantages of the invention will become apparent from the description which follows.

BRIEF DESCRIPTION OF THE DRAWINGS

FIGS. 7, 8, 9, 10, 11, 12 and 13 show the step by step operation of the apparatus of FIG. 6.

DETAILED DESCRIPTION OF THE PREFERRED METHOD AND APPARATUS

Figure 1:
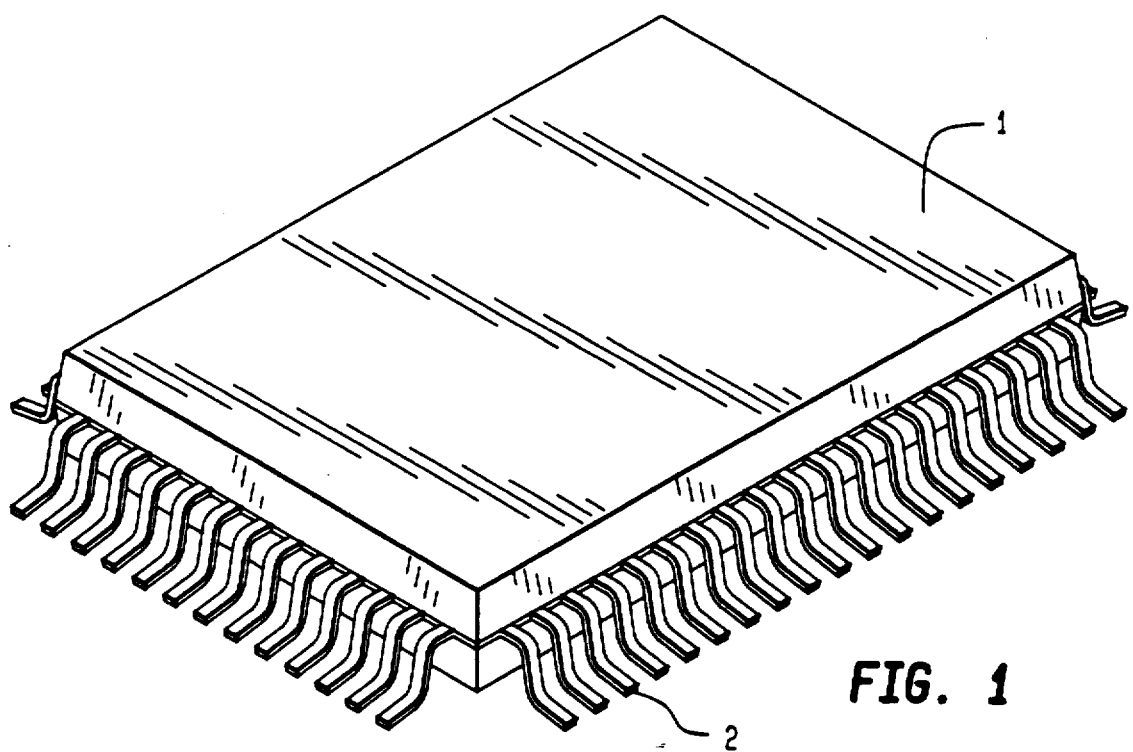
FIG. 1 is a perspective view of a typical conventional integrated circuit chip.

FIG. 1 shows a chip comprising a chip body 1 and arrays of electrical leads 2 along each edge of the body 1.

Figure 2:
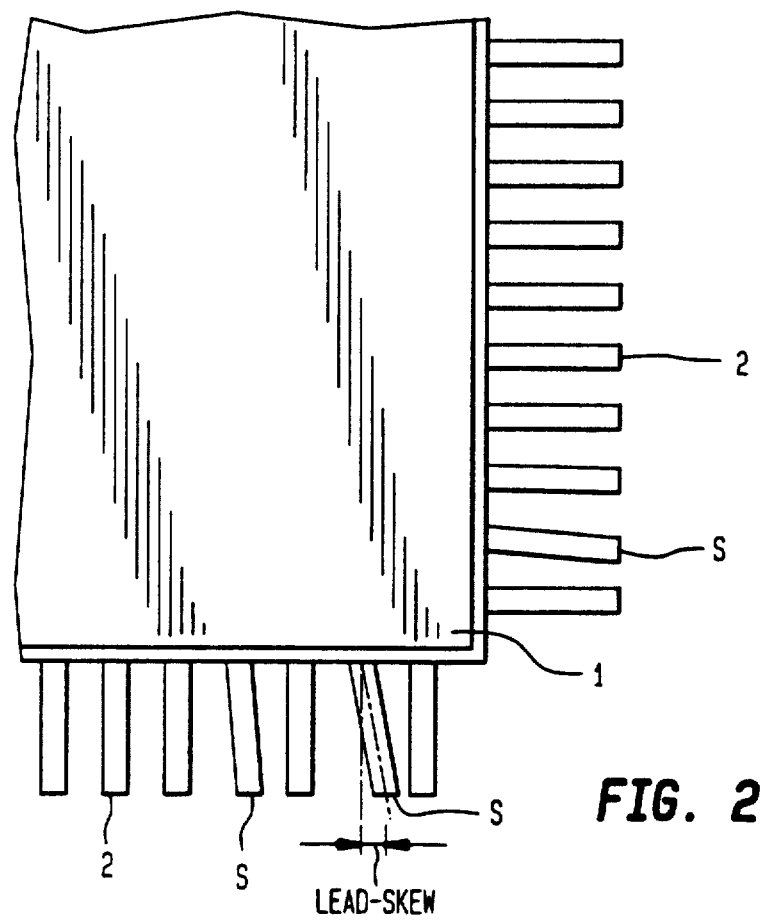
FIG. 2 is a plan view on a larger scale of a part of a chip, in which some of the electrical leads are skewed out of position.

In FIG. 2 some of the electrical leads 2 are skewed out of position, these electrical leads being indicated by the letter "S".

Figure 3:
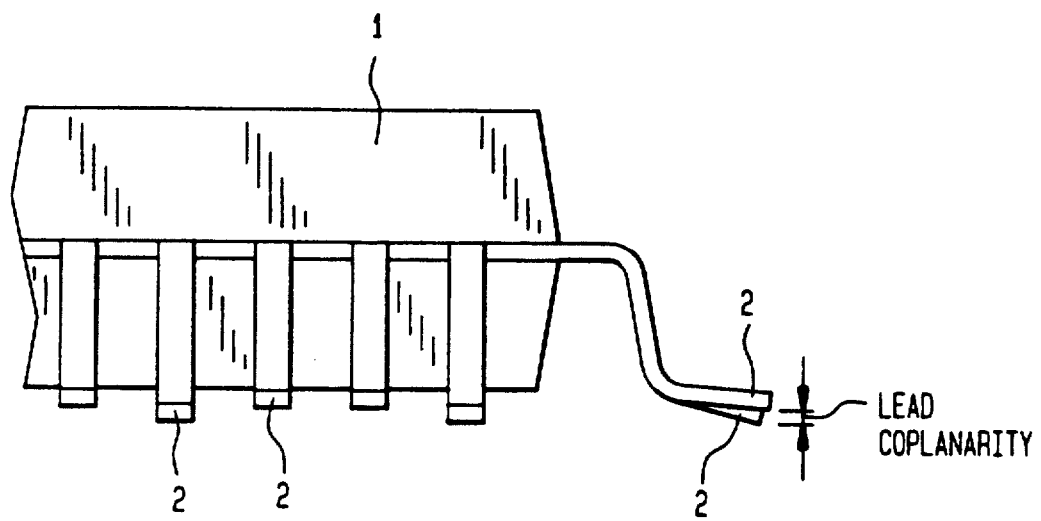
FIG. 3 is a side elevation on a larger scale of part of a chip, in which some of the electrical leads are non-coplanar.

In FIG. 3 the electrical leads 2 are not coplanar.

Figure 4:
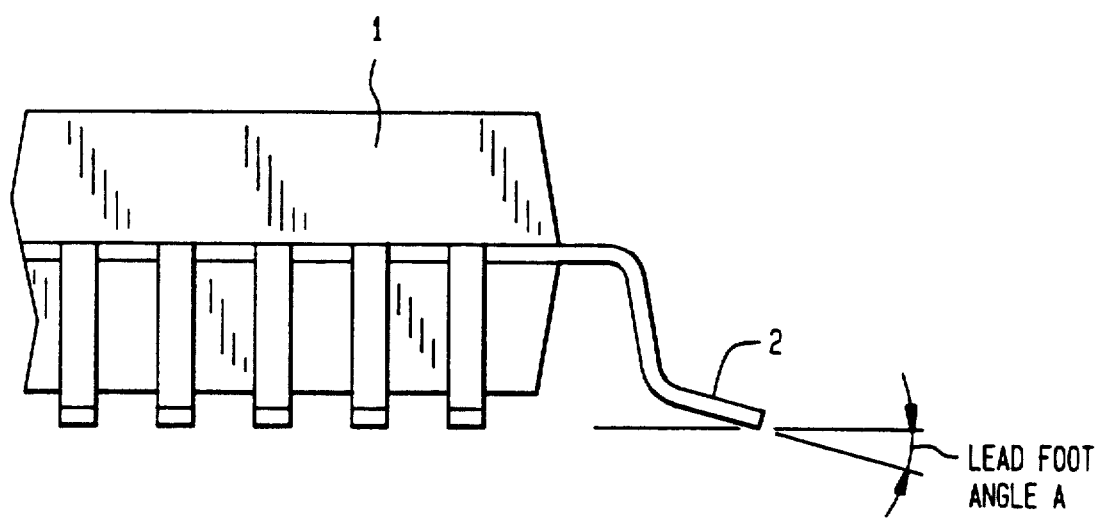
FIG. 4 is a side view on a larger scale of part of a chip illustrating the concept of lead foot angle.

In FIG. 4 the concept of lead foot angle of the electrical leads 2 is illustrated, indicated by angle "A".

Figure 5A:
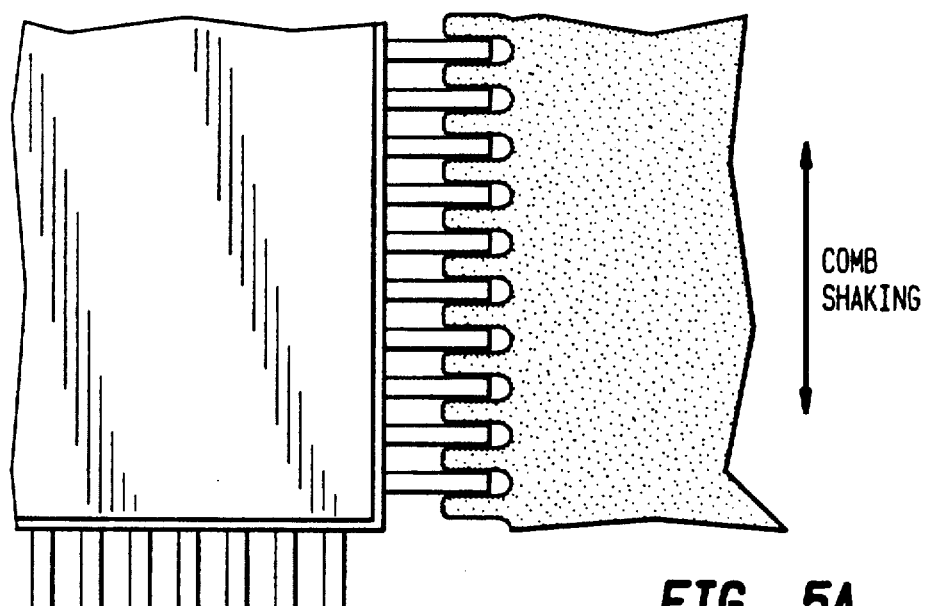
FIGS. 5A, 5B and 5C illustrate the prior art step by step method of correcting distortions.
Figure 5B:
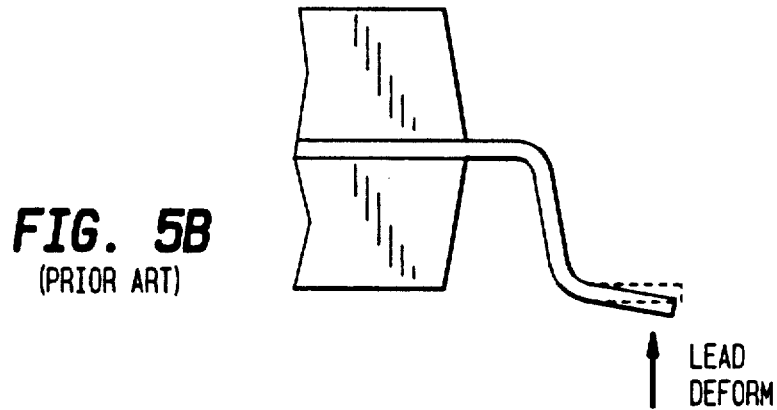
Figure 5C:
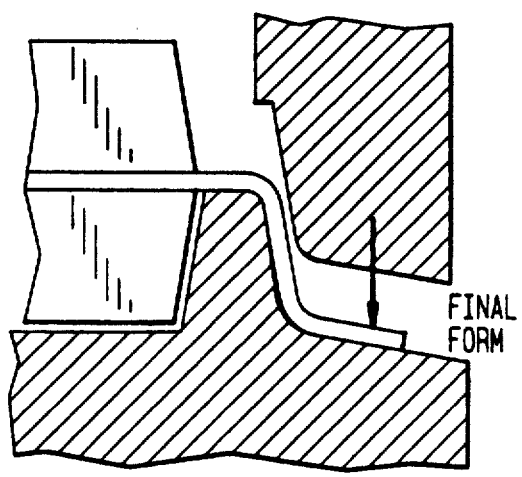

Referring to FIGS. 5A, 5B and 5C, in the prior art the skew angle is corrected by inserting a comb between the feet of the electrical leads and then reciprocating the comb from side to side in the direction indicated by the arrow. This operation is carried out at a first workstation. Thereafter the chip 1 is sent to a second workstation to deform the leads 2 as shown in FIG. 5B, and to a third workstation to final form the leads 2 as shown in FIG. 5C.

Figure 6:
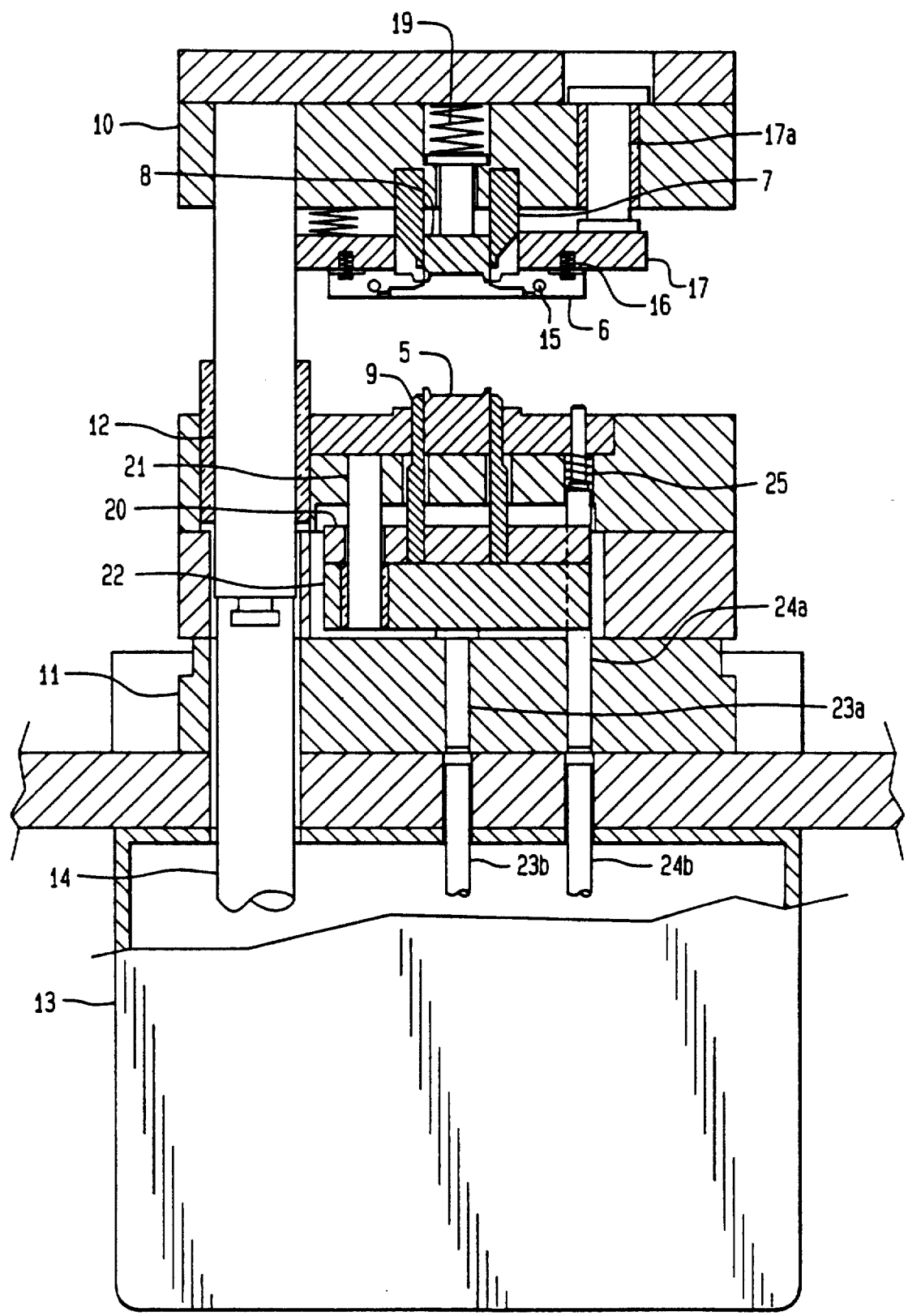
FIG. 6 is a schematic sectional elevation view of apparatus in accordance with the invention for correcting distortions.

Referring to FIG. 6 the apparatus comprises a single workstation at which all three types of distortion are corrected. In FIG. 6 the various moving parts of the apparatus are all set in the appropriate position to receive a chip which is to be corrected.

FIG. 7 shows a chip 1, 2 (indicated by dashed lines) placed in position on a fixed anvil 5.

FIG. 8 shows a comb 6 introduced into meshing engagement with the electrical leads 2 in the region of the shoulder of the leads to align the chip 1, 2 in the correct position on the anvil 5 and an upper movable punch 7 moved downwardly to an intermediate position, and clamp 8 moved downwardly into position to engage the top shoulder of the lead 2 and hold it in the aligned position.

Referring to FIG. 9 the comb 6 is then moved pivotally in a direction parallel to the leads 2 to correct any skewed electrical leads 2, and is left in position with the comb teeth between the feet of the leads.

Referring to FIG. 10, the comb 6 remains in position and a lower moveable forming anvil 9 is shown advanced upwardly so as to deform all the electrical leads 2 upwardly.

Referring to FIG. 11, the comb 6 remains in position and the lower moveable forming anvil 9 is retracted.

Referring to FIG. 12, the comb 6 remains in position and punch 7 is shown advanced downwardly so that the electrical leads 2 are formed between the punch 7 and the lower moveable forming anvil 9.

FIG. 13 shows the comb 6 pivotally retracted from meshing engagement with the feet of the electrical leads but the punch 7 and anvil 9 still in position.

Referring back to FIG. 6, the principal components of the apparatus, namely the fixed anvil 5, comb 6, punch 7, clamp 8 and lower movable forming anvil 9, have already been identified in the foregoing description with reference to FIGS. 7 to 13, and the remaining components in FIG. 6 will now be identified. These components include a movable top retainer 10, a fixed bottom retainer 11, a main pillar 12 fixed to the movable top retainer 10 and slidably moveable relative to the fixed bottom retainer 11, a driving module 13, a pillar drive rod 14 which is part of the driving module 13, a pivot mounting 15 for the comb 6, a return spring 16 for the comb 6, a comb holder 17 and holder guide 17a, the clamp 8 also acting as a stripper for preventing the work adhering to the punch 8, a stripper spring 19, a lower movable anvil holder 20 which is slidably moveable along an anvil guide pillar 21, an anvil back plate 22, an anvil pusher 23a, 23b, a comb pusher 24a, 24b, and a return spring 25.

The comb 6, the punch 7, the lower moveable anvil 9 and the stripper 18 are all made of a plastic material impregnated with an electrically conductive material, and are all readily detachable from their respective mountings. When these components have been used a number of times they may be removed, discarded, and replaced by new components. It is economic to discard these components and replace them by new components because the cost of production of the plastic components to the correct tolerance is only a tiny fraction of the cost of production of metal components machined to the same tolerance. Impregnating the components with an electrically conductive material prevents any build-up of static electricity on the working surfaces of these components, which might otherwise damage the integrated circuit chips.

The plastic material can either be thermoplastic or be thermosetting. For thermoplastic material, such as polyoxymethylene, injection molding is used. For thermosetting material, such as resin, transfer molding is used. The strength of the plastic material should be relatively high. Moreover, resistance to wearing is also important.

Figure 14A:
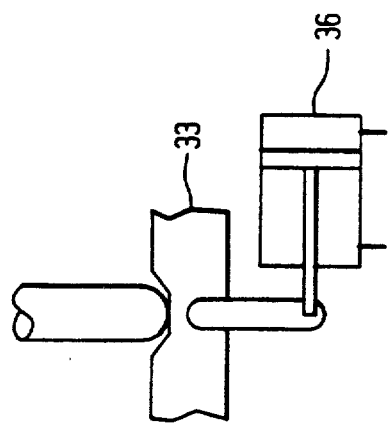
FIGS. 14 and 14A show a drive arrangement for the apparatus of FIG. 6.
Figure 14:
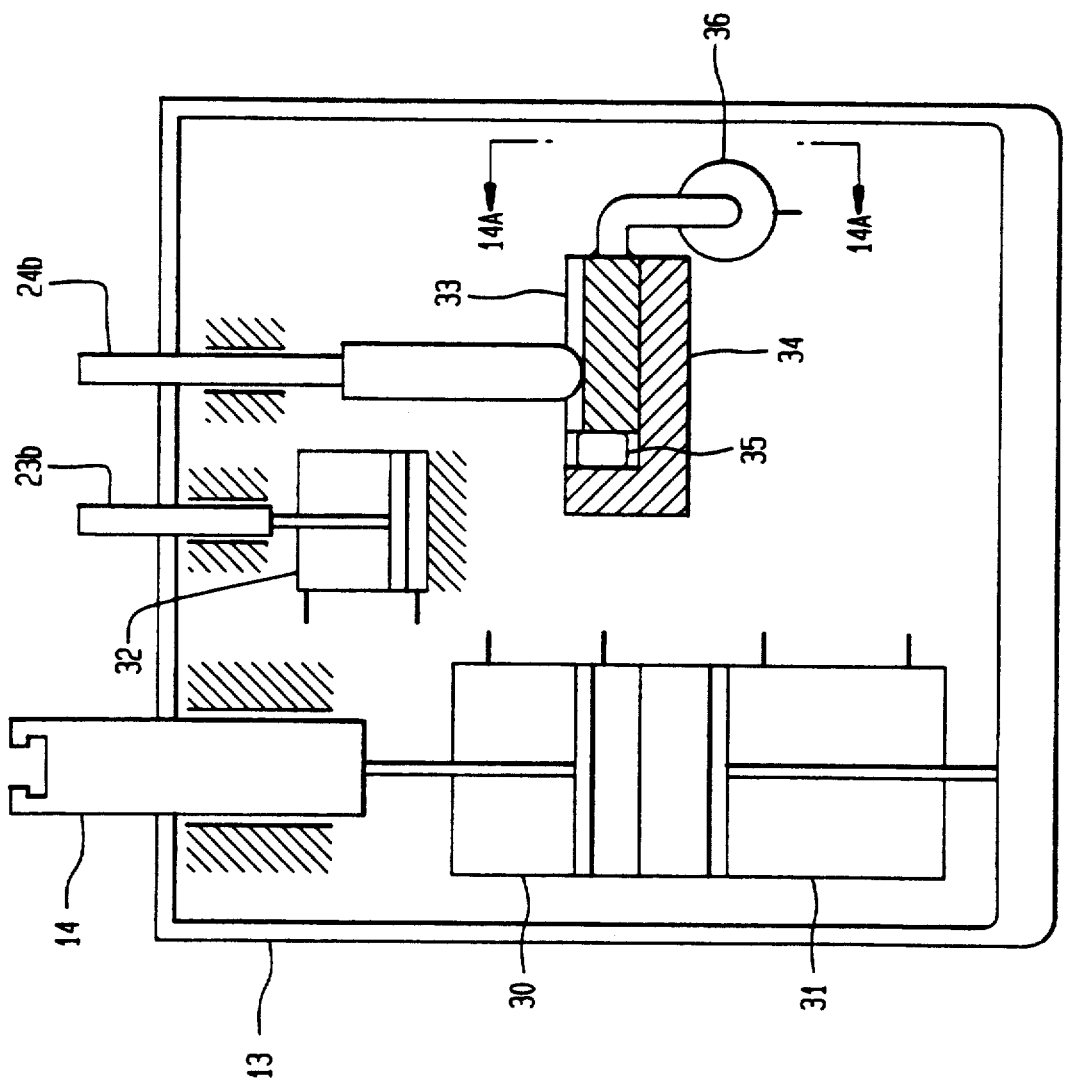

Referring to FIG. 14 the drive mechanism comprises three drive subassemblies. The first subassembly moves the movable top retainer 10 relative to the fixed bottom retainer 11 and in particular allows the top retainer 10 to be moved between any one of three positions, an upper position as shown in FIG. 7, an intermediate position as shown in FIGS. 8, 9, 10 and 11 and a lower position as shown in FIGS. 12 and 13. For this purpose the first subassembly consists of two pneumatic cylinders and pistons 30, 31 arranged back to back for moving the pillar drive rod 14. The second subassembly moves the lower movable forming anvil 9 between the upper and lower positions and consists of a single pneumatic cylinder and piston 32. The third subassembly moves the comb 6 pivotally in the direction along the length of the electrical leads 2. For this purpose the subassembly consists of a sliding cam 33, a cam holder 34, a roller bearing 35 and a pneumatic cylinder and piston 36.

The above described method of correcting skewed electrical leads first and then correcting the other two distortions by deforming and final forming while continuously preventing a skew distortion from reappearing is given by way of example only. The essential feature is that the various steps be carried out simultaneously rather than in sequence so that a distortion when corrected does not reappear.

For convenience the use of electrically conductive plastic tools has been described in relation to the apparatus for correcting distortions in the electrical leads of integrated circuit chips. However it will be appreciated that the electrically conductive plastic tools have much wider uses in the semiconductor industry, in particular in machines for use in all stages of manufacturing, handling, testing and correcting integrated circuit chips and other semiconductor components.

The invention being thus described, it will be obvious that the same may be varied in many ways. Various modifications are therefore included in the scope of the invention unless they depart from scope and spirit as defined in the following claims.

We claim:

1. A method for correcting distortions of electrical leads with project from an integrated circuit chip of the type having feet which are oriented generally parallel to a surface on which the chip is to be mounted, said method comprising the steps of:
   (a) fixedly locating said chip in a clamping means with said electrical leads projecting therefrom,
   (b) inserting a comb-like member between said leads and correcting thereby any skew distortion,
   (c) deforming said leads in a direction perpendicular to the plane of the chip,
   (d) final forming the leads to ensure coplanarity of the leads and to ensure that the feet of the leads are at the correct angle to the plane of the chip, and
   (e) removing said chip from said clamping means.

2. A method as claimed in claim 1 wherein said comb-like member is moved in a direction parallel to said leads to correct said skew distortion.

3. A method as claimed in claim 1 wherein said comb-like member remains inserted between said leads during said steps (c) and (d) to prevent re-introduction of any skew distortion.

4. A method as claimed in claim 1 wherein said final forming is carried out by pressing the leads against an anvil by means of a punch in a direction opposite to the direction of step (c).

5. Apparatus for correcting distortions of electrical leads of the type having feet and projecting from an integrated circuit chip, comprising clamping means for fixedly locating said chip with said electrical leads projecting therefrom, a comb-like member for insertion between said leads, means for deforming the leads in a direction perpendicular to the plane of the chip, and means for final forming the leads to ensure coplanarity of the leads and to ensure that the feet of the leads are at the correct angle to the plane of the chip.

6. Apparatus as claimed in claim 5 wherein said final forming means comprises a punch and anvil.

7. Apparatus as claimed in claim 5 including means for moving said anvil toward said punch whereby said anvil comprises said deforming means, and wherein said moving means is adapted to retract said anvil prior to operation of said punch.

8. Apparatus as claimed in claim 5 wherein at least one of said comb-like member, said punch, and said anvil is formed of an electrically conductive plastic material.

* * * * *